United States Patent
Tu et al.

(10) Patent No.: US 7,824,942 B2
(45) Date of Patent: Nov. 2, 2010

(54) METHOD OF FABRICATING PHOTOELECTRIC DEVICE OF GROUP III NITRIDE SEMICONDUCTOR AND STRUCTURE THEREOF

(75) Inventors: Po Min Tu, Chiayi County (TW); Shih Cheng Huang, Hsinchu (TW); Wen Yu Lin, Taichung County (TW); Chih Peng Hsu, Tainan County (TW); Shih Hsiung Chan, Hsinchu County (TW)

(73) Assignees: Zhanjing Technology (Shen Zhen) Inc., Shenzhen, Guangdong Province (CN); Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 12/426,010

(22) Filed: Apr. 17, 2009

(65) Prior Publication Data
US 2009/0267097 A1  Oct. 29, 2009

(30) Foreign Application Priority Data
Apr. 28, 2008  (TW) .............................. 97115512 A

(51) Int. Cl.
*H01L 21/00* (2006.01)
(52) U.S. Cl. ................................. 438/46; 257/E21.097
(58) Field of Classification Search .................. 438/46; 257/E21.097, E33.002
See application file for complete search history.

(56) References Cited

U.S. PATENT DOCUMENTS

| 6,071,795 | A | 6/2000 | Cheung et al. |
| 6,617,261 | B2 | 9/2003 | Wong et al. |
| 6,740,604 | B2 | 5/2004 | Kelly et al. |
| 6,746,889 | B1 | 6/2004 | Eliashevich et al. |
| 2009/0267097 | A1* | 10/2009 | Tu et al. ....................... 257/98 |

* cited by examiner

*Primary Examiner*—Mark Prenty
(74) *Attorney, Agent, or Firm*—Raymond J. Chew

(57) ABSTRACT

A method of fabricating a photoelectric device of Group III nitride semiconductor comprises the steps of: forming a first Group III nitride semiconductor layer on a surface of an original substrate; forming a patterned epitaxial-blocking layer on the first Group III nitride semiconductor layer; forming a second Group III nitride semiconductor layer on the epitaxial-blocking layer and the first Group III nitride semiconductor layer not covered by the epitaxial-blocking layer and then removing the epitaxial-blocking layer; forming a third Group III nitride semiconductor layer on the second Group III nitride semiconductor layer; depositing or adhering a conductive layer on the third Group III nitride semiconductor layer; and releasing a combination of the third Group III nitride semiconductor layer and the conductive layer apart from the second Group III nitride semiconductor layer.

14 Claims, 9 Drawing Sheets

METHOD OF FABRICATING PHOTOELECTRIC DEVICE OF GROUP III NITRIDE SEMICONDUCTOR AND STRUCTURE THEREOF

BACKGROUND OF THE INVENTION

1. Field of the Invention

The present invention relates to the structure and fabricating method of a photoelectric device of Group III nitride semiconductor, and relates more particularly to the light emitting structure of a photoelectric device and the fabricating method thereof.

2. Description of the Related Art

Currently, light emitting diodes made of gallium nitride material or Group III nitride semiconductor material are built upon a sapphire substrate mainly because the degree of lattice mismatch between sapphire and Group III nitride semiconductor material is low (although a buffer layer is still often required to improve the mismatch therebetween). However, sapphire substrates have many disadvantages, such as high insulation characteristics, and due to such characteristics it is not easy to create a light emitting diode made of Group III nitride semiconductor material having a vertical conductive structure. Therefore, technology continues to advance and allow use of other substrate materials, such as silicon carbide, to reduce such disadvantages. Due to its greater conductivity, silicon carbide can be used to produce a conductive substrate, and because the degree of lattice match between silicon carbide and Group III nitride active layer is low, using a buffer layer made of gallium nitride or aluminum gallium nitride, a Group III nitride semiconductor layer can be deposited on a silicon carbide substrate. Moreover, due to its high stability, silicon carbide is becoming more important in such manufacturing processes. Although a Group III nitride semiconductor layer can be deposited on a silicon carbide substrate with the help of a buffer layer made of gallium nitride or aluminum gallium nitride, the degree of lattice match between a Group III nitride semiconductor material and silicon carbide (which is lower than the degree of lattice match between aluminum gallium nitride and silicon carbide) often causes defects in an epitaxial layer even where the buffer layer is formed on a silicon carbide substrate. Furthermore, a silicon carbide substrate is more expensive than substrates made of other materials.

FIGS. 1A and 1B show a method of separating a thin film from a growth substrate, disclosed in U.S. Pat. No. 6,071,795. The method initially forms a separation region 12 and a silicon nitride layer 13 on a sapphire substrate 11, and then a bonding layer 14 is disposed on the surface of the silicon nitride layer 13. Next, with the help of the bonding layer 14, a silicon substrate 15 is bonded to the above-mentioned sapphire substrate 11 with a stacked-layer structure. A laser beam penetrating the sapphire substrate 11 is directed at the separation region 12, and causes the separation region to decompose. Finally, the remnant material of the decomposed separation region 12 is cleared to obtain a composite including the silicon substrate 15 and the silicon nitride layer 13. However, because the bonding layer 14 between the silicon substrate 15 and the silicon nitride layer 13 is dielectric, the composite cannot be a basis for building a vertical structure light emitting diode. Moreover, if the material for the bonding layer 14 is disposed incorrectly or selected improperly, the bonding is affected, and defects are formed in the silicon nitride layer 13.

FIG. 2 shows a method of separating two layers of material from one another, disclosed in U.S. Pat. No. 6,740,604. The technology used for the disclosure related to FIG. 2 is similar to the technology for the disclosure related to FIGS. 1A and 1B. A laser beam 23 is directed at the interface between a first semiconductor layer 21 and a second semiconductor layer 22, and initiates the decomposition of the second semiconductor layer 22 at the interface. Finally, the first semiconductor layer 21 is separated from the second semiconductor layer 22. The second semiconductor layer 22 can be the film layer formed on a substrate. In such process, a substrate replaces the first semiconductor layer 21, and then both are separated.

FIG. 3 shows a structure prior to separation of the substrate, disclosed in U.S. Pat. No. 6,746,889. The method initially grows several epitaxial layers, which comprise the first region 32 of a first conductivity type, a light-emitting p-n junction 33, and the second region 34 of a second conductivity type, on a substrate 31. Next, several sawing streets 36 are cut through the epitaxial layers of the first region 32, light-emitting p-n junction 33 and second region 34 to have a plurality of individual optoelectronic devices or dies 35 formed on the substrate 31. Thereafter, the second region 34 is bonded to a submount 37. As shown in the above-mentioned prior art technology, a laser beam, in the same manner, penetrating the substrate 31 causes the substrate 31 to separate from the first region 32. Separated optoelectronic devices or dies 35 can be removed from the submount 37 and proceed through the packaging processes. Obviously, when the epitaxial layers are cut through, individual optoelectronic devices or dies 35 bonded to the submount 37 squeeze one another by external forces such that die cracks may occur.

FIG. 4 is a side view of the laser lift-off process for removing a sapphire substrate, disclosed in U.S. Pat. No. 6,617,261. A gallium nitride layer 42 is initially formed on a sapphire substrate 41, and then a plurality of grooves 44 are formed by etching process. Next, a silicon substrate 43 is bonded to the surface where the gallium nitride layer 42 is formed and then is etched to form the grooves 44. Thereafter, an ultraviolet excimer laser 45 emits a laser beam 46 to the sapphire substrate 41. The laser beam 46 penetrates the transparent sapphire substrate 41 to cause the gallium nitride at the interface to decompose so as to obtain a silicon substrate 43 bonded with the gallium nitride layer 42. Any residual gallium metal on the surface of the gallium nitride layer 42 is removed by hydrochloric acid. The gallium nitride layer 42 is finally cleaned for subsequent deposition processes.

Conventional technologies use high-energy laser beams to separate substrates or light emitting dies. However, those technologies have low throughput and require expensive equipment. Therefore, a new separation technology that has none of the above-mentioned issues, can guarantee the quality of produced light emitting dies, and can be applied to mass production is required by the market.

SUMMARY OF THE INVENTION

The primary objective of the present invention is to provide a photoelectric device of Group III nitride semiconductor and a fabricating method thereof. The method can employ an insulating original substrate as a base for epitaxy, which is then removed to obtain a photoelectric device of Group III nitride semiconductor having a vertical conductive structure.

Another objective of the present invention is to provide a photoelectric device of Group III nitride semiconductor and the fabricating method thereof using conventional processes and equipment so as to minimize manufacturing cost.

In order to achieve the above objectives, the present invention proposes a method of fabricating a photoelectric device of Group III nitride semiconductor, with the method comprising the steps of: forming a first Group III nitride semiconductor layer on a surface of an original substrate; forming a patterned epitaxial-blocking layer on the first Group III nitride semiconductor layer; forming a second Group III nitride semiconductor layer on the epitaxial-blocking layer and on the portions of the first Group III nitride semiconductor layer not covered by the epitaxial-blocking layer, and then removing the epitaxial-blocking layer; forming a third Group III nitride semiconductor layer on the second Group III nitride semiconductor layer; depositing or adhering a conductive layer on the third Group III nitride semiconductor layer; and releasing a combination of the third Group III nitride semiconductor layer and the conductive layer apart from the second Group III nitride semiconductor layer.

According to one embodiment, the method of fabricating a photoelectric device of Group III nitride semiconductor further comprises a step of forming a metallic mirror layer between the third Group III nitride semiconductor layer and the conductive layer.

The material of the epitaxial-blocking layer is preferably silica.

According to one embodiment, the conductive layer is formed by electroplating, composite electroplating, or bonding to deposit copper (Cu), nickel (Ni), copper tungsten alloy (CuW), silicon (Si), or silicon carbide (SiC).

According to one embodiment, the material of the original substrate comprises sapphire, silicon carbide, silicon, zinc oxide, magnesium oxide, and gallium arsenide.

According to one embodiment, the second Group III nitride semiconductor layer is decomposed by wet etching so that the combination of the third Group III nitride semiconductor layer and the conductive layer is separated from the original substrate.

According to one embodiment, the method further comprises a step of forming an N-type semiconductor layer, an active layer, and a P-type semiconductor layer between the third Group III nitride semiconductor layer and the metallic mirror layer.

According to one embodiment, the epitaxial-blocking layer comprises a plurality of convexes and a plurality of grooves among the convexes.

According to one embodiment, the method of fabricating a photoelectric device of Group III nitride semiconductor further comprises a step of disposing an etching protection layer on the conductive layer and the metallic mirror layer.

According to one embodiment, the second Group III nitride semiconductor layer comprises a plurality of mushroom blocks or mushroom strips protruding on the first Group III nitride semiconductor layer. The third Group III nitride semiconductor layer is laterally grown from the sides of each of the mushroom blocks or the mushroom strips to join each other. The profile of each of the mushroom blocks or the mushroom strips can be changed by controlling the growth conditions of the third Group III nitride semiconductor layer.

The present invention proposes a photoelectric device of Group III nitride semiconductor, which comprises a Group III nitride semiconductor layer, a metallic mirror layer formed on the Group III nitride semiconductor layer; and a conductive layer formed on the metallic mirror layer.

According to one embodiment, the material of the Group III nitride semiconductor layer is $Al_xIn_yGa_{1-x-y}N$, wherein $0 \leq x \leq 1$ and $0 \leq y \leq 1$.

BRIEF DESCRIPTION OF THE DRAWINGS

The invention will be described according to the appended drawings in which.

DETAILED DESCRIPTION OF THE INVENTION

Figure 1A:
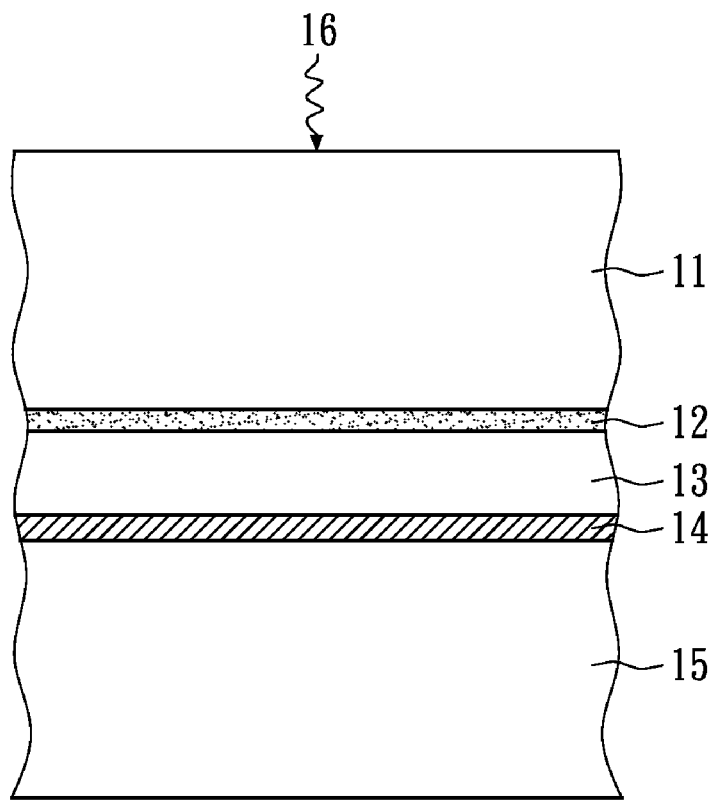
FIGS. 1A and 1B show a method of separating a thin film from a growth substrate, disclosed in U.S. Pat. No. 6,071,795.
Figure 1B:
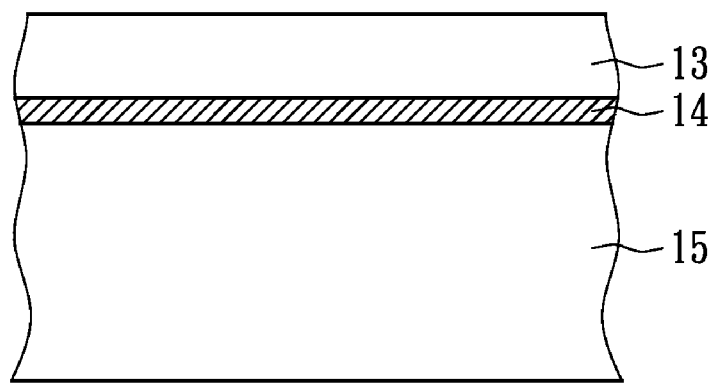
Figure 2:
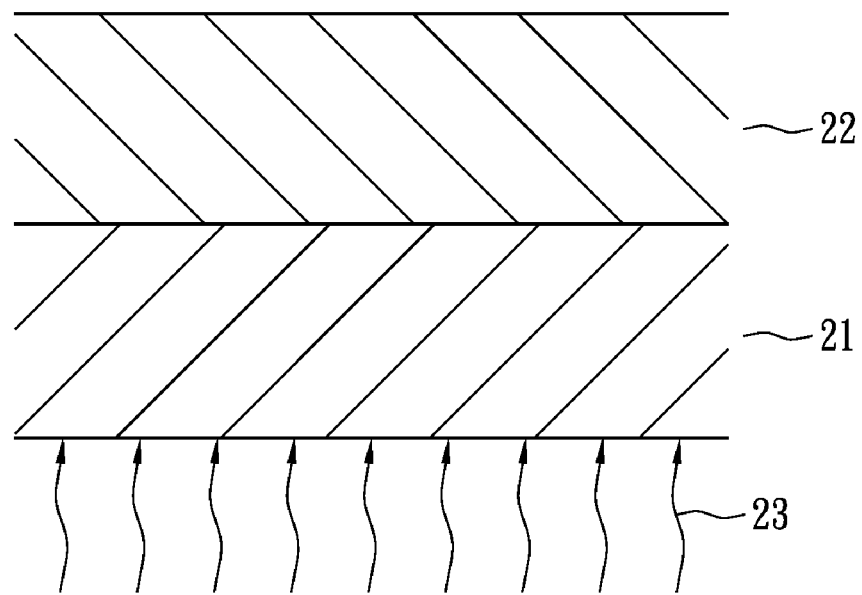
FIG. 2 shows a method of separating two layers of material from one another, disclosed in U.S. Pat. No. 6,740,604.
Figure 3:
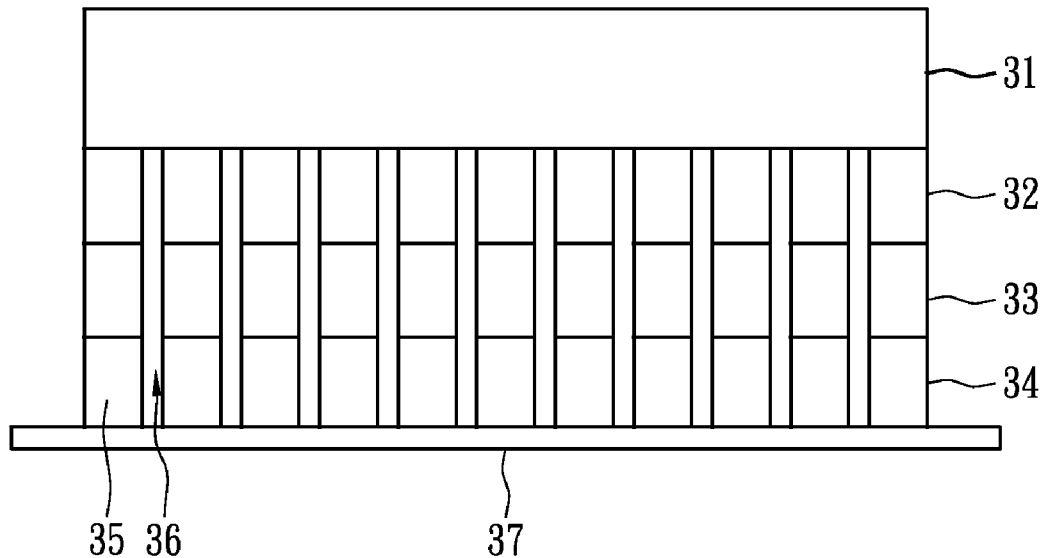
FIG. 3 shows a structure before a substrate is separated, disclosed in U.S. Pat. No. 6,746,889.
Figure 4:
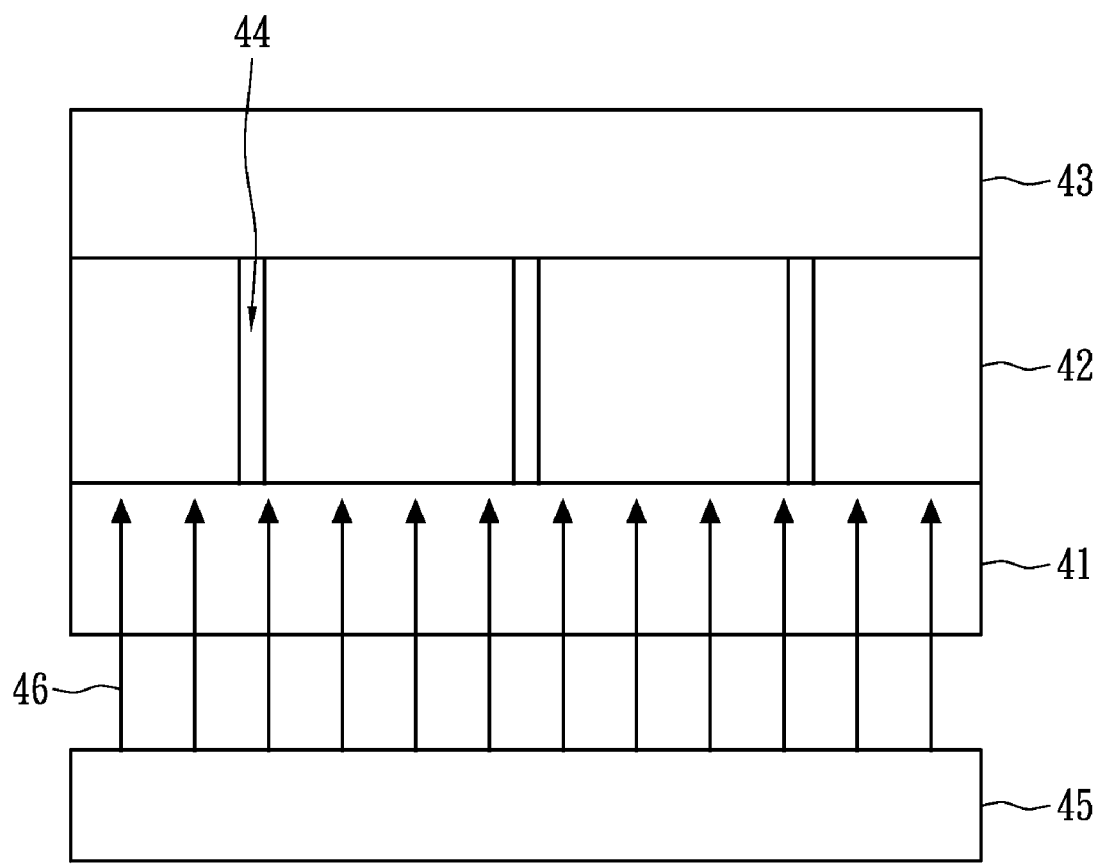
FIG. 4 is a side view of the laser lift-off process for removing a sapphire substrate, disclosed in U.S. Pat. No. 6,617,261.
Figure 5:
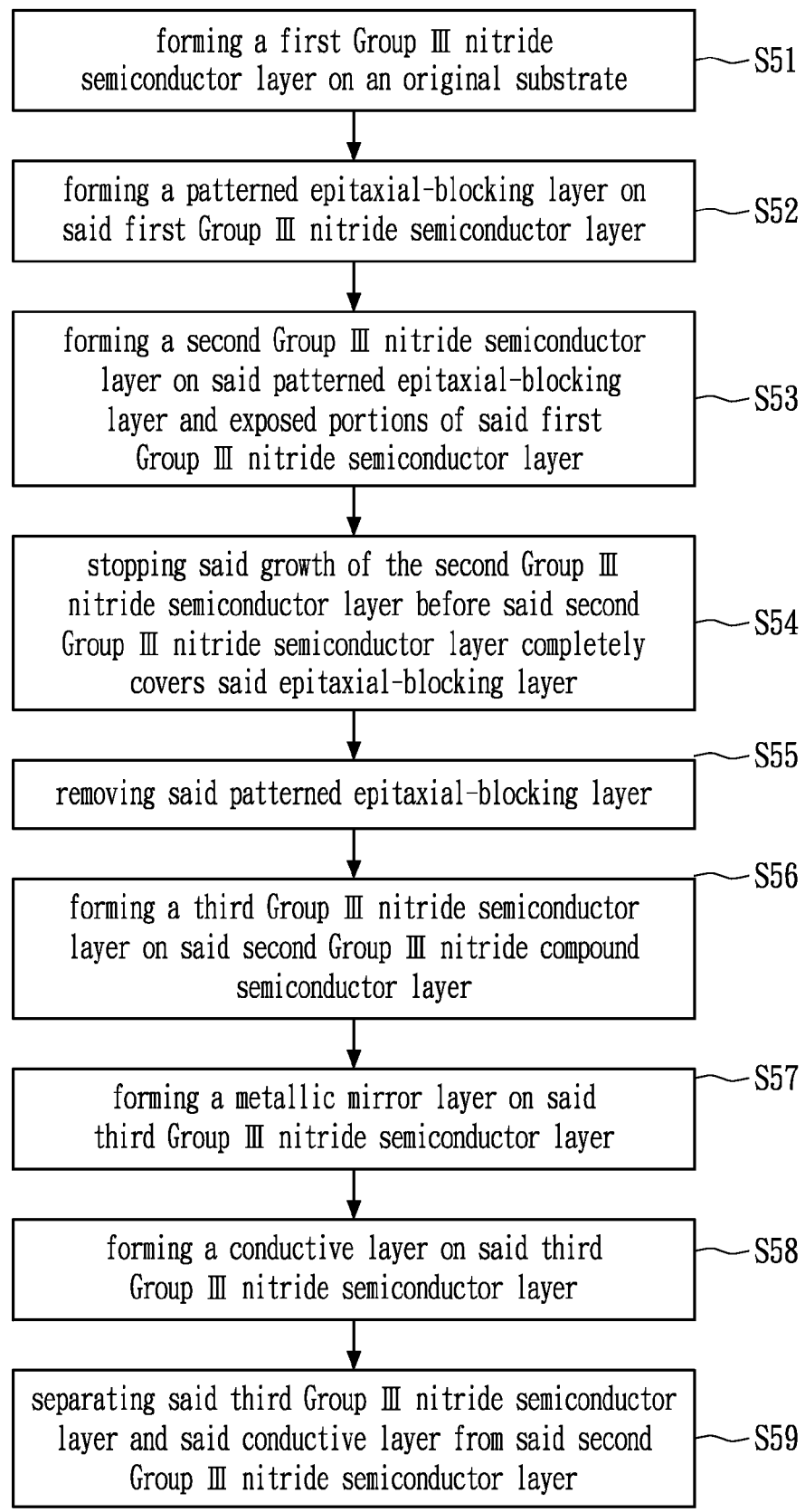
FIG. 5 is a flow chart showing a process for fabricating a photoelectric device of Group III nitride semiconductor according to one embodiment of the present invention.

FIG. 5 is a flow chart showing a process for fabricating a photoelectric device of Group III nitride semiconductor according to one embodiment of the present invention. In Step S51, a first Group III nitride semiconductor layer is formed on a surface of a original substrate, such as a sapphire substrate (i.e. aluminum oxide, $Al_2O_3$), silicon carbide (SiC) substrate, silicon substrate, zinc oxide (ZnO) substrate, magnesium oxide (MgO) substrate, gallium arsenide (GaAs) substrate, etc. Then, in Step S52, using photolithography and etching process to form a patterned epitaxial-blocking layer on the first Group III nitride semiconductor layer. For example a patterned silicon oxide. That is, the epitaxial-blocking layer with a default pattern covers partial surfaces of the first Group III nitride semiconductor layer.

Subsequently, a second Group III nitride semiconductor layer is grown on the epitaxial-blocking layer and the exposed portions of the first Group III nitride semiconductor layer, as shown in Step S53. Before the second Group III nitride semiconductor layer completely covers the epitaxial-blocking layer, the growth of the second Group III nitride semiconductor layer is stopped. Then, the epitaxial-blocking layer is removed, as shown in Step S54 and S55.

In Step S56, a third Group III nitride semiconductor layer is grown on the second Group III nitride semiconductor layer. Next, a metallic mirror layer is formed on the third Group III nitride semiconductor layer, as shown in Step S57. The metallic mirror layer can reflect the light emitted from the third Group III nitride semiconductor layer. As shown in Step S58, a conductive material is deposited on the third Group III nitride semiconductor layer. For example, the conductive layer is formed by electroplating, composite electroplating, or bonding to deposit copper (Cu), nickel (Ni), copper tungsten alloy (CuW), silicon (Si), or silicon carbide (SiC) so that the light emitting diode has a vertical conductive structure. A photoelectric device of Group III nitride semiconductor with a single vertical conductive structure is obtained by releasing the combination of the third Group III nitride semiconductor layer and the conductive layer apart from the second Group III nitride semiconductor layer, as shown in Step S59. The second Group III nitride semiconductor layer can be decomposed by an etching step.

Figure 6A:
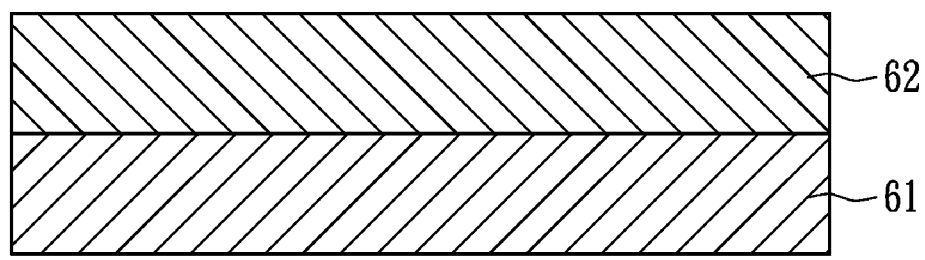
FIGS. 6A-6G are schematic diagrams illustrating a process for fabricating a photoelectric device of Group III nitride semiconductor according to one embodiment of the present invention.
Figure 6B:
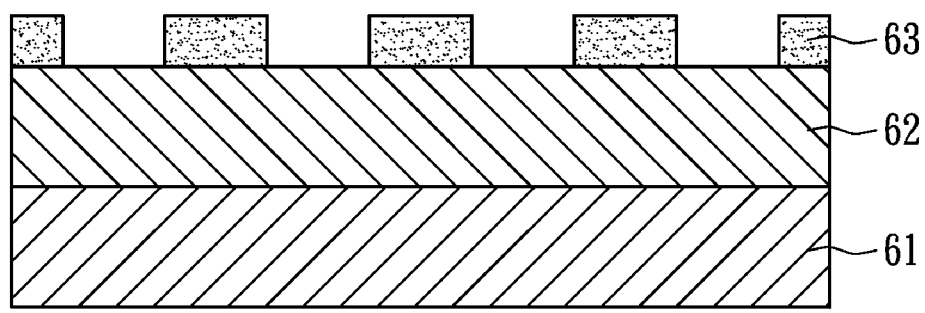
Figure 6C:
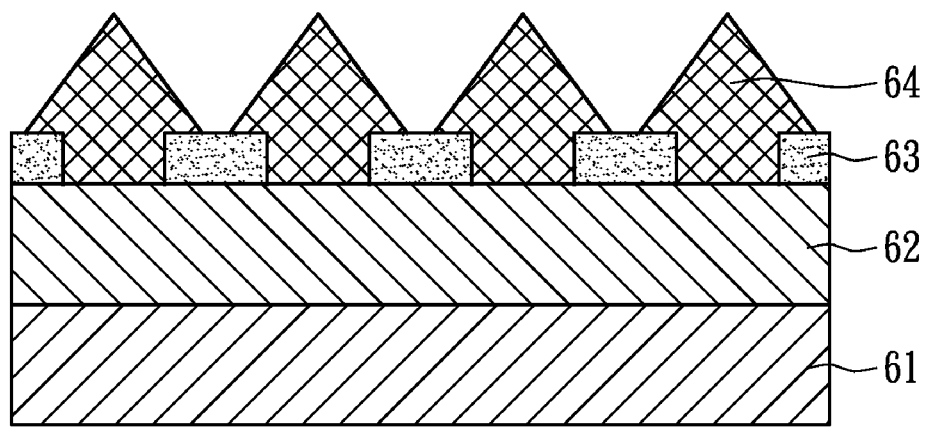

FIGS. 6A-6G are schematic diagrams illustrating a process for fabricating a photoelectric device of Group III nitride semiconductor according to one embodiment of the present invention. A first Group III nitride semiconductor layer 62 is formed on the surface of an original substrate 61. A patterned epitaxial-blocking layer 63 is formed on the first Group III nitride semiconductor layer 62. A second Group III nitride semiconductor layer 64 is formed on the epitaxial-blocking layer 63 and the surface of the first Group III nitride semiconductor layer 62 not covered by the epitaxial-blocking layer 63, as shown in FIG. 6C. The second Group III nitride semiconductor layer 64 is laterally overgrown on the portion of the surface of the first Group III nitride semiconductor layer 62 where the epitaxial-blocking layer 63 does not cover from the middle of each of the openings. Therefore, the defects of threading dislocation are reduced. Furthermore, the direction of a threading dislocation defect occurring in the second Group III nitride semiconductor layer 64 located in the opening is redirected to extend in parallel manner along the surface of the original substrate 61. This threading dislocation defect will meet another defect propagating in an opposite direction so that the density of vertical threading dislocation is reduced.

Figure 6D:
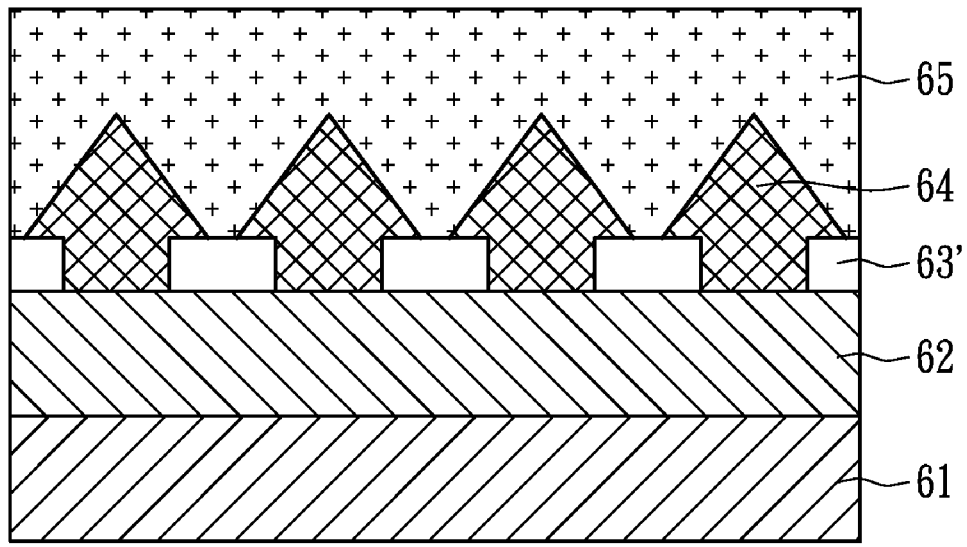
Figure 6E:
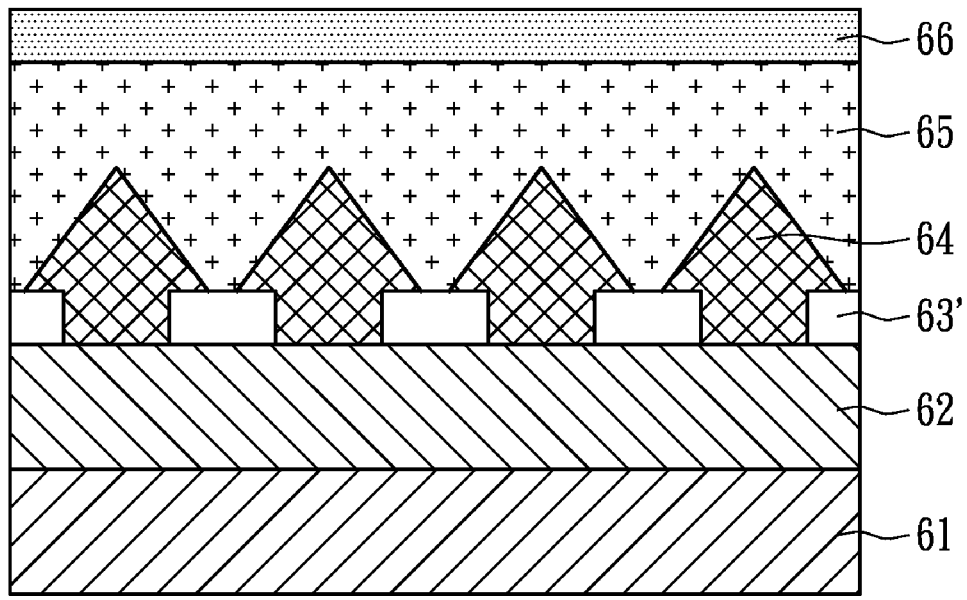
Figure 6F:
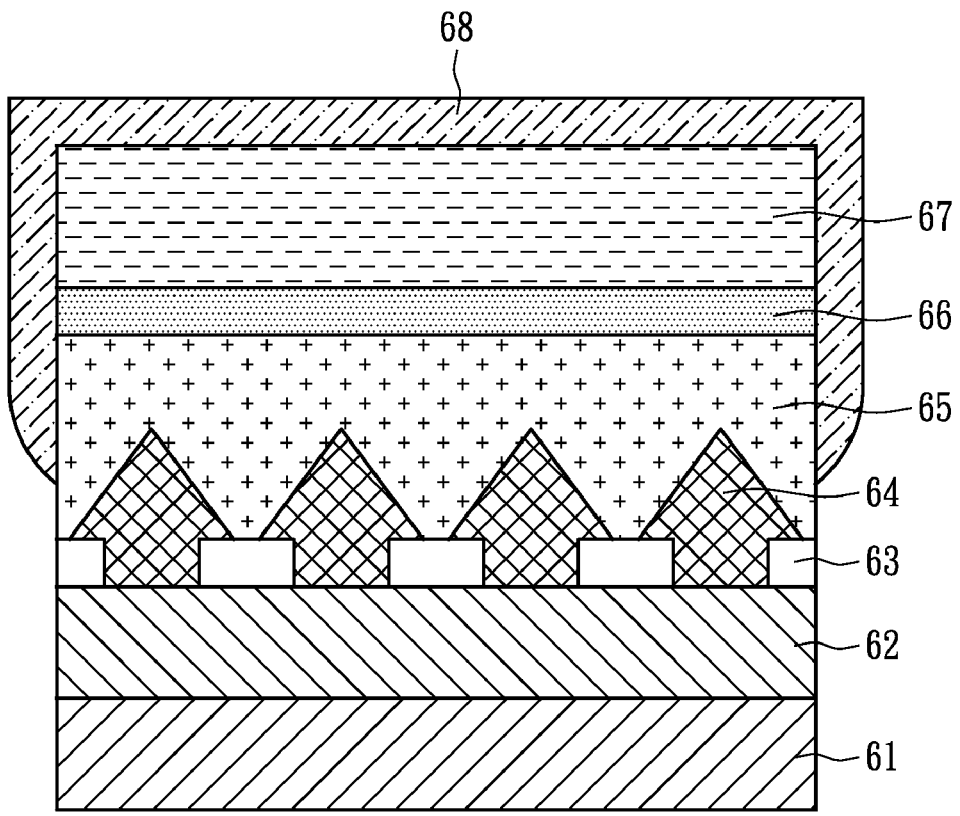

As shown in FIG. 6D, the epitaxial-blocking layer 63 is removed by an etching process, and grooves 63' appear. Consequently, the mushroom-blocks or mushroom-strips of the second Group III nitride semiconductor layer 64 are erected on the first Group III nitride semiconductor layer 62. Afterward, a third Group III nitride semiconductor layer 65 is formed on the mushroom-blocks or mushroom-strips of the second Group III nitride semiconductor layer 64. The third Group III nitride semiconductor layer 65 is laterally grown from the sides of each of the mushroom members of the second Group III nitride semiconductor layer 64 until the separate segments from each mushroom member join together into one layer. As shown in FIG. 6E, a metallic mirror layer 66 is formed on the third Group III nitride semiconductor layer 65.

Figure 6G:
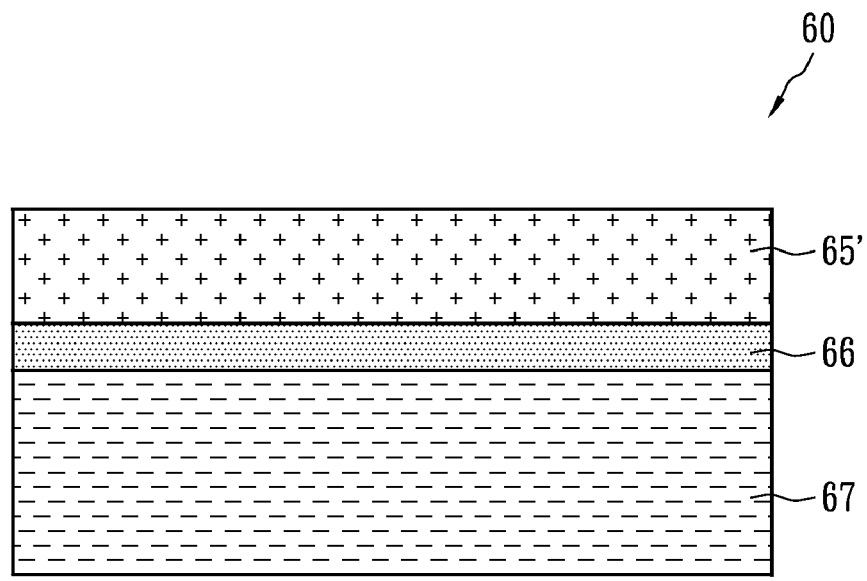

A conductive layer 67 is deposited on or adhered to the metallic mirror layer 66. For example, copper (Cu), nickel (Ni), copper tungsten alloy (CuW), silicon (Si), or silicon carbide (SiC) is deposited thereon by electroplating, composite electroplating, or bonding. In addition to excellent electrical conductivity, the conductive layer 66 can also improve heat conductivity. Depositing an etching protection layer 68, for example a silicon dioxide ($SiO_2$) layer, to protect the conductive layer 67 and the mirror metal layer 66 from the corrosion of the etchant. Under the protection of the etching protection layer 68, the conductive layer 67 and the mirror metal layer 66 will not be exposed to the etchant so as to avoid damage. Consequently, the etchant is brought into the grooves 63' of the second Group III nitride semiconductor layer 64 so that the second Group III nitride semiconductor layer 64 and parts of the third Group III nitride semiconductor layer 65 are decomposed. The combination of the treated third Group III nitride semiconductor layer 65' and the layers stacked on the layer 65' is released from the second Group III nitride semiconductor layer 62. Next, the etching protection layer 68 is removed so as to obtain a photoelectric device 60 of Group III nitride semiconductor, as shown in FIG. 6G.

The metallic mirror layer 66 is selectable, and depends on the package type of the photoelectric device for reflecting light. The material of the second Group III nitride semiconductor layer 64 and the third Group III nitride semiconductor layer 65 is $Al_xIn_yGa_{1-x-y}N$, wherein $0 \leq x \leq 1$ and $0 \leq y \leq 1$ and such material helps the deposition of the silicon doped N-type gallium nitride layer. The third Group III nitride semiconductor layer 65 can include a light emitting structure, and specifically can include an N-type semiconductor layer, an active layer (light emitting layer), and a P-type semiconductor layer, or a light emitting structure can be further formed between the third Group III nitride semiconductor layer 65 and the metallic mirror layer 66.

Figure 7A:
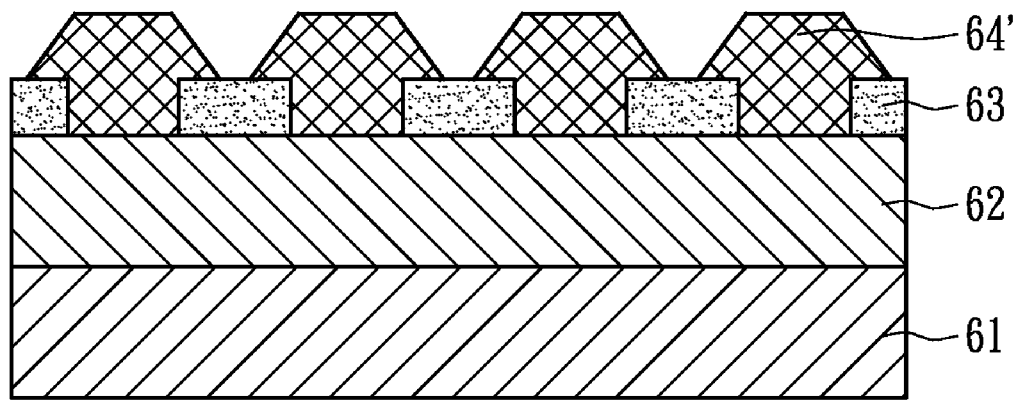
FIGS. 7A and 7B are schematic diagrams illustrating a process for fabricating a photoelectric device of Group III nitride semiconductor according to another embodiment of the present invention.
Figure 7B:
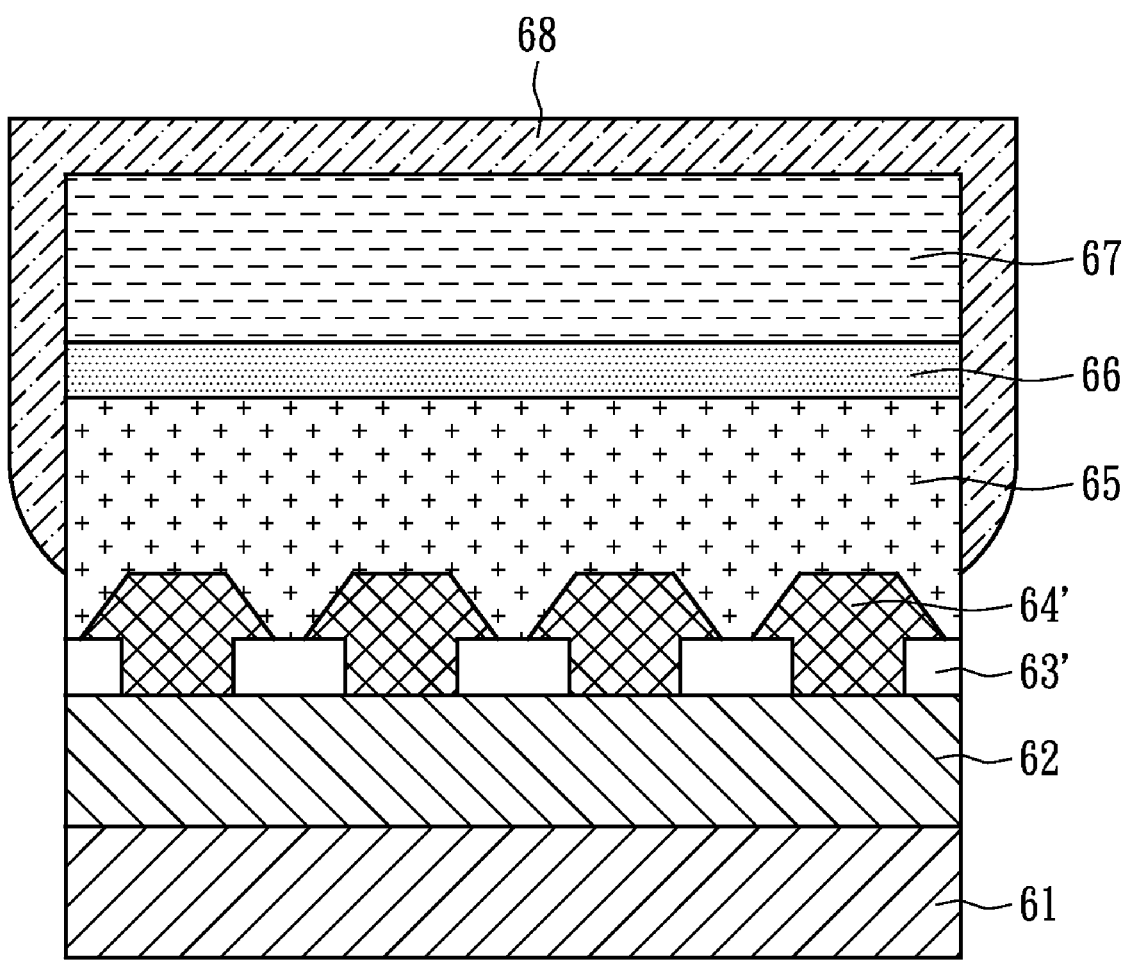

The profile of each of the mushroom blocks or the mushroom strips can be changed by controlling growth conditions of the second Group III nitride semiconductor layer 64 such as the flow rate of the elements of Group III nitride, temperature and time. Compared with FIG. 6C, the second Group III nitride semiconductor layer 64' in FIG. 7A has flat tops rather than sharp tops. Similarly, after the epitaxial-blocking layer 63 is removed, the third Group III nitride semiconductor layer 65, metallic mirror layer 66 and etching protection layer 68 are sequentially formed, as shown in FIG. 7B. The combination of the treated third Group III nitride semiconductor layer 65 and the layers stacked on the layer 65 is released from the second Group III nitride semiconductor layer 62 by using wet etching technology. Furthermore, the etching protection layer 68 is removed so as to obtain a vertical photoelectric device of Group III nitride semiconductor.

Figure 8A:
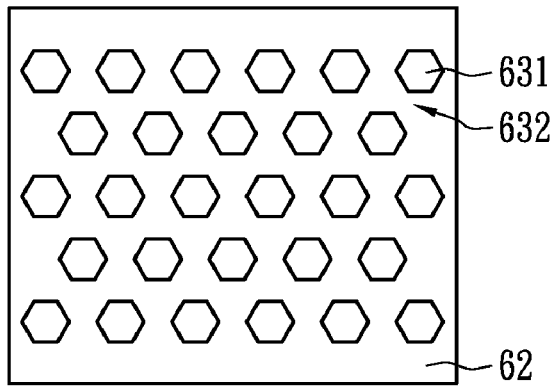
FIGS. 8A-8D are schematic diagrams illustrating patterned first Group III nitride semiconductor layers according to embodiments of the present invention.
Figure 8B:
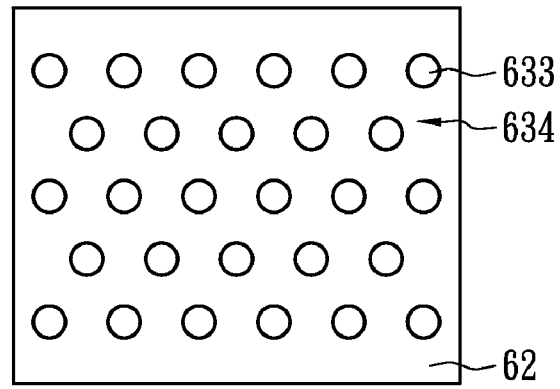
Figure 8C:
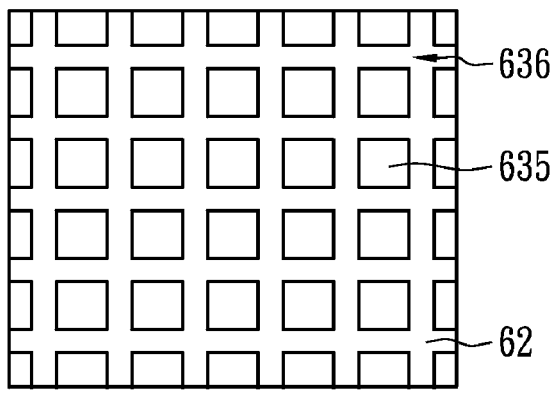
Figure 8D:
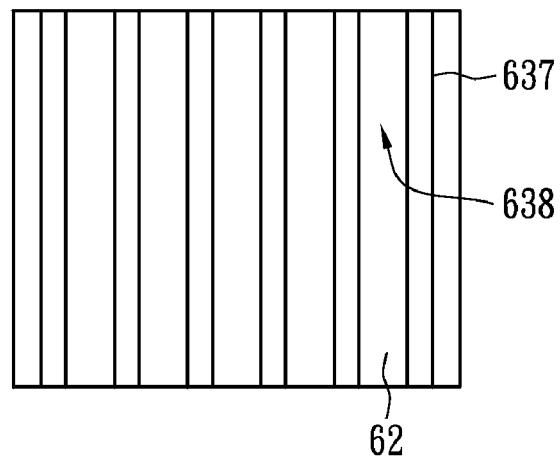

FIGS. 8A-8D are schematic diagrams illustrating patterned first Group III nitride semiconductor layers according to embodiments of the present invention. As shown in FIG. 8A, the epitaxial-blocking layer 63 has a plurality of hexagonal cylinders 631 and a plurality of grooves 632 connected together. As shown in FIG. 8B, the epitaxial-blocking layer 63 has a plurality of circular cylinders 633 and a plurality of grooves 634 connected together. As shown in FIG. 8C, the epitaxial-blocking layer 63 has a plurality of rectangular cylinders 635 and a plurality of grooves 636 connected together. As shown in FIG. 8D, the epitaxial-blocking layer 63 has a plurality of convexes 637 and a plurality of grooves 628 separating the convexes 627, and the convex 627 can have a strip-like shape.

The above-described embodiments of the present invention are intended to be illustrative only. Numerous alternative embodiments may be devised by persons skilled in the art without departing from the scope of the following claims.

What is claimed is:

1. A method for fabricating a photoelectric device of Group III nitride semiconductor, comprising steps of:
   forming a first Group III nitride semiconductor layer on a substrate;
   forming a patterned epitaxial-blocking layer on said first Group III nitride semiconductor layer;
   forming a second Group III nitride semiconductor layer on said patterned epitaxial-blocking layer and on portions of said first Group III nitride semiconductor layer not covered by said epitaxial-blocking layer;
   removing said patterned epitaxial-blocking layer from said first Group III nitride semiconductor layer and said second Group III nitride semiconductor layer;
   forming a third Group III nitride semiconductor layer on said second Group III nitride semiconductor layer;
   forming a conductive layer on said third Group III nitride semiconductor layer; and
   separating said third Group III nitride semiconductor layer and said conductive layer from said second Group III nitride semiconductor layer.

2. The method according to claim 1, wherein said patterned epitaxial-blocking layer is silicon oxide.

3. The method according to claim 1, further comprising a step of forming a metallic minor layer between said third Group III nitride semiconductor layer and said conductive layer.

4. The method according to claim 1, wherein said conductive layer is copper (Cu), nickel (Ni), copper tungsten alloy (CuW), silicon (Si), or silicon carbide (SiC) deposited by electroplating, composite electroplating, or bonding.

5. The method according to claim 1, wherein material of said substrate is sapphire ($Al_2O_3$), silicon carbide (SiC), silicon (Si), zinc oxide (ZnO), magnesium oxide (MgO) or gallium arsenide (GaAs).

6. The method according to claim 3, wherein said second Group III nitride compound semiconductor layer is decomposed by wet etching so that said third Group III nitride semiconductor layer and said conductive layer are separated from said second Group III nitride compound semiconductor layer.

7. The method according to claim 3, further comprising an N-type semiconductor material layer, an active layer and a P-type semiconductor material layer between said third Group III nitride semiconductor layer and said metallic mirror layer.

8. The method according to claim 1, wherein said patterned epitaxial-blocking layer comprises a plurality of convexes and a plurality of grooves between said plurality of convexes.

9. The method according to claim 8, wherein said plurality of convexes are hexagonal cylinders, circular cylinders or tetragonal cylinders, and said plurality of grooves surround said plurality of convexes respectively.

10. The method according to claim 8, wherein said plurality of convexes have a strip-like profile, and said plurality of grooves separate said adjacent convexes.

11. The method according to claim 3, further comprising a step for forming an etching protection layer on said conductive layer and said metallic mirror layer to avoid etching thereon.

12. The method according to claim 1 wherein said second Group III nitride semiconductor layer comprises a plurality of mushroom blocks or mushroom strips protruding on said first Group III nitride semiconductor layer.

13. The method according to claim 12, wherein said third Group III nitride compound semiconductor layer is laterally grown from sides of said mushroom blocks or said mushroom strips of said second Group III nitride compound semiconductor layer to join each other.

14. The method according to claim 12, wherein the profile of each of said mushroom blocks or the mushroom strips is changed by controlling the growth conditions of the second Group III nitride semiconductor layer.

* * * * *